(12) United States Patent  
Yi

(10) Patent No.: US 12,411,379 B2  
(45) Date of Patent: Sep. 9, 2025

(54) MANUFACTURING METHOD OF COLOR FILTER FILM SUBSTRATE

(71) Applicant: WUHAN CHINA STAR OPTOELECTRONICS SEMICONDUCTOR DISPLAY TECHNOLOGY CO., LTD., Hubei (CN)

(72) Inventor: Tianhua Yi, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 1486 days.

(21) Appl. No.: 16/614,939

(22) PCT Filed: Nov. 14, 2018

(86) PCT No.: PCT/CN2018/115428  
§ 371 (c)(1),  
(2) Date: Nov. 19, 2019

(87) PCT Pub. No.: WO2020/010770  
PCT Pub. Date: Jan. 16, 2020

(65) Prior Publication Data  
US 2020/0225533 A1    Jul. 16, 2020

(30) Foreign Application Priority Data  
Jul. 10, 2018    (CN) .......................... 201810748566.0

(51) Int. Cl.  
*G02F 1/1335* (2006.01)  
*G03F 7/00* (2006.01)  
(Continued)

(52) U.S. Cl.  
CPC ...... *G02F 1/133516* (2013.01); *G03F 7/0007* (2013.01); *G03F 7/004* (2013.01); *G03F 7/039* (2013.01); *G03F 7/2022* (2013.01)

(58) Field of Classification Search  
CPC .. G02F 1/133516; G03F 7/0007; G03F 7/004; G03F 7/039; G03F 7/2022  
See application file for complete search history.

(56) References Cited

U.S. PATENT DOCUMENTS 5,725,915 A * 3/1998 Ishitaka ............ G02F 1/133528  
428/1.31  
2006/0045966 A1* 3/2006 Suzuki ................... G02B 5/201  
427/164

(Continued)

FOREIGN PATENT DOCUMENTS

CN    1740828 A    3/2006  
CN    101609227 A    12/2009

(Continued)

OTHER PUBLICATIONS

English machine translation of JP-2017223942-A (Dec. 2017) (Year: 2017).*

(Continued)

*Primary Examiner* — Jonathan Johnson  
*Assistant Examiner* — Jayson D Cosgrove  
(74) *Attorney, Agent, or Firm* — PV IP PC; Wei Te Chung

(57) ABSTRACT

The present invention provides a color film substrate manufacturing method, the method including providing a substrate; forming a photoresist layer on the substrate, the photoresist layer including a predetermined coloring material, and the photoresist layer including a first region, a second region, and a third region; applying multiple exposures to the predetermined coloring materials in the first region, the second region, and the third region, so that the (Continued)

first region transmits a first predetermined light, the second region transmits a second predetermined light, and the third region transmits a third predetermined light.

18 Claims, 4 Drawing Sheets

(51) Int. Cl.
    *G03F 7/004* (2006.01)
    *G03F 7/039* (2006.01)
    *G03F 7/20* (2006.01)

(56) References Cited

U.S. PATENT DOCUMENTS

| | | | |
|---|---|---|---|
| 2007/0292770 A1* | 12/2007 | Strauss | G03F 7/70416 |
| | | | 430/394 |
| 2010/0025641 A1 | 2/2010 | Jimbo | |
| 2012/0008120 A1* | 1/2012 | Matsui | G03F 1/50 |
| | | | 355/53 |
| 2016/0103361 A1* | 4/2016 | Wang | G02B 5/223 |
| | | | 359/891 |
| 2018/0088262 A1* | 3/2018 | Lee | G02B 5/223 |
| 2018/0108842 A1* | 4/2018 | Li | H10K 59/35 |
| 2019/0375198 A1* | 12/2019 | Baker | C08K 5/3472 |

FOREIGN PATENT DOCUMENTS

| | | | | |
|---|---|---|---|---|
| CN | 101840155 A | 9/2010 | | |
| CN | 102119347 A | 7/2011 | | |
| CN | 102253599 A | 11/2011 | | |
| CN | 104330926 A | 2/2015 | | |
| CN | 105116596 A | 12/2015 | | |
| CN | 105974653 A | 9/2016 | | |
| CN | 107015399 A | 8/2017 | | |
| CN | 107608179 A | 1/2018 | | |
| JP | H10121029 A | 5/1998 | | |
| JP | 2014206618 A | 10/2014 | | |
| JP | 2017223942 A | * 12/2017 | | C07D 487/04 |
| KR | 20120123930 A | * 11/2012 | | C07D 498/04 |

OTHER PUBLICATIONS

English machine translation of KR-20120123930-A (Nov. 2012) (Year: 2012).*

* cited by examiner

MANUFACTURING METHOD OF COLOR FILTER FILM SUBSTRATE

FIELD OF INVENTION

The present invention relates to a field of display technologies, and in particular, to a color film substrate manufacturing method.

BACKGROUND OF INVENTION

Liquid crystal display (LCD) has the advantages such as good picture quality, small size, light weight, low driving voltage, low power consumption, no radiation and relatively low manufacturing cost, and is dominant in the field of flat panel display.

Among them, color film substrate is an important component of the liquid crystal display device. The manufacturing process of a color film substrate shown in FIG. 1 requires three different types of photoresists, three coating times, three exposure times, and three development times, to manufacture a color film substrate with three different photoresists.

In this process, less than one-third of the photoresist is effectively utilized, resulting in low utilization of the photoresist. At the same time, repeated process need to be transported back and forth between different machines, so the time cost increases.

Technical Problem

An object of the present invention is to provide a color film substrate manufacturing method, which improves the efficiency of manufacturing a color film substrate.

SUMMARY OF INVENTION

An embodiment according to the present invention provides a color film substrate manufacturing method, including steps of:
providing a substrate;
forming a photoresist layer on the substrate, the photoresist layer including a photoresist material and a predetermined coloring material, wherein the predetermined coloring material is uniformly distributed in the photoresist material, and the photoresist layer includes a first region, a second region and a third region; and
applying multiple exposures to the predetermined coloring material of the first region, the second region and the third region, such that the first region enables to transmit a first predetermined light, the second region enables to transmit a second predetermined light, and the third region enables to transmit a third predetermined light.

In some embodiments, the predetermined coloring material includes a first functional group, a second functional group, and a third functional group, and wherein the first functional group is configured to absorb a first predetermined light, the second functional group is configured to absorb the second predetermined light, and the third functional group is configured to absorb third predetermined light; and
wherein the step of applying a plurality of exposures to the first region, the second region and the third region of the predetermined coloring material, such that the first region enables to transmit the first predetermined light, the second region enables to transmit the second predetermined light, and the third region enables to transmit the third predetermined light includes steps of:
exposing the first region to decompose the first functional group within the first region;
exposing the second region to decompose the second functional group within the second region; and
exposing the third region to decompose the third functional group within the third region.

In some embodiments, the first predetermined light is a red light, and the first functional group includes —NH2- and =O.

In some embodiments, the second predetermined light is a green light, and the step of exposing the second region to decompose the second functional group within the second region includes step of:
if the second region has:

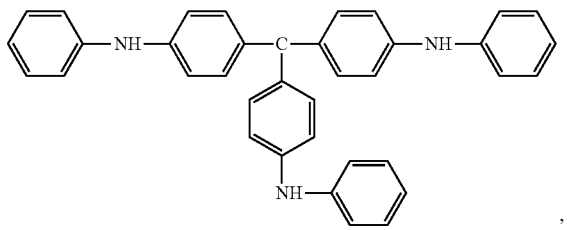 [SMILES: c1ccc(Nc2ccc(C(c3ccc(Nc4ccccc4)cc3)c3ccc(Nc4ccccc4)cc3)cc2)cc1]

then decomposing the

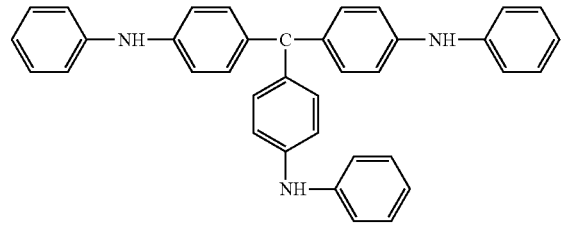 [SMILES: c1ccc(Nc2ccc(C(c3ccc(Nc4ccccc4)cc3)c3ccc(Nc4ccccc4)cc3)cc2)cc1]

within the second region.

In some embodiments, the third predetermined light is a blue light, and the third functional group includes:

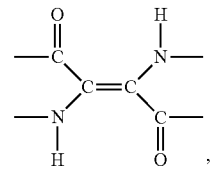

In some embodiments, the predetermined coloring material includes a first additive material, a second additive material, a third additive material, and a fourth additive material; and
wherein the step of applying multiple exposure to the predetermined coloring material of the first region, the second region and the third region, such that the first region enables to transmit the first predetermined light, the second region enables to transmit the second predetermined light, and the third region enables to transmit the third predetermined light includes steps of:
exposing the first region and the second region to cause the third additive material and the fourth additive material within the first region and the second region to generate a first target functional group, wherein the first target functional group absorbs the third predetermined light;

exposing the first region and the third region to cause the second additive material and the fourth additive material within the first region and the third region to generate a second target functional group, wherein the second target functional group absorbs the second predetermined light; and exposing the second region and the third region to cause the first additive material and the fourth additive material within the second region and the third region to generate a third target functional group, wherein the third target functional group absorbs the first predetermined light.

In some embodiments, the first additive material includes:

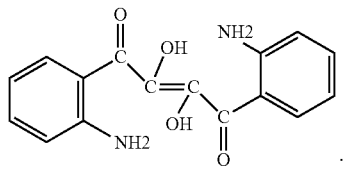 [SMILES: Nc1ccccc1C(=O)/C(O)=C(/O)C(=O)c1ccccc1N]

In some embodiments, the second additive material includes:

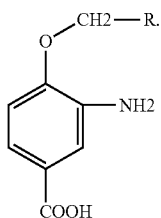

In some embodiments, the third additive material includes:

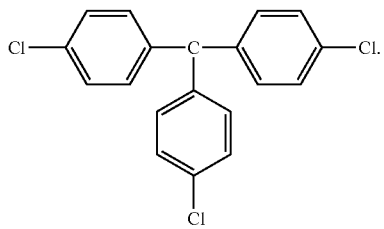

In some embodiments, the fourth additive material includes:

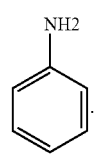

An embodiment according to the present invention provides a color film substrate manufacturing method, including steps of:

providing a substrate;

forming a photoresist layer on the substrate, the photoresist layer including a predetermined coloring material, wherein the photoresist layer includes a first region, a second region and a third region; and applying multiple exposures to the predetermined coloring material of the first region, the second region and the third region, such that the first region enables to transmit a first predetermined light, the second region enables to transmit a second predetermined light, and the third region enables to transmit a third predetermined light.

In some embodiments, the predetermined coloring material includes a first functional group, a second functional group, and a third functional group, and wherein the first functional group is configured to absorb a first predetermined light, the second functional group is configured to absorb the second predetermined light, and the third functional group is configured to absorb third predetermined light; and wherein the step of applying a plurality of exposures to the first region, the second region and the third region of the predetermined coloring material, such that the first region enables to transmit the first predetermined light, the second region enables to transmit the second predetermined light, and the third region enables to transmit the third predetermined light includes steps of:

exposing the first region to decompose the first functional group within the first region;

exposing the second region to decompose the second functional group within the second region; and exposing the third region to decompose the third functional group within the third region.

In some embodiments, the first predetermined light is a red light, and the first functional group includes —NH2- and =O.

In some embodiments, the second predetermined light is a green light, and the step of exposing the second region to decompose the second functional group within the second region includes step of:

if the second region has:

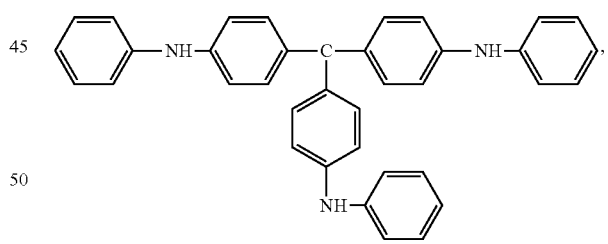

then decomposing the

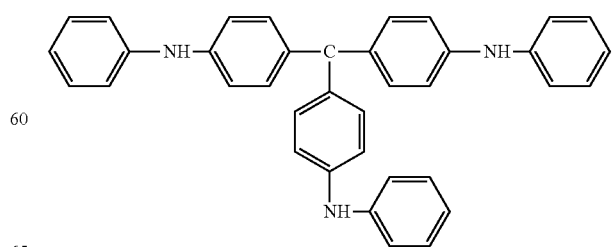

within the second region.

In some embodiments, the third predetermined light is a blue light, and the third functional group includes:

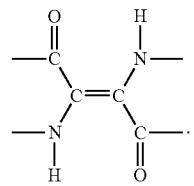

In some embodiments, the predetermined coloring material includes a first additive material, a second additive material, a third additive material, and a fourth additive material; and
  wherein the step of applying multiple exposure to the predetermined coloring material of the first region, the second region and the third region, such that the first region enables to transmit the first predetermined light, the second region enables to transmit the second predetermined light, and the third region enables to transmit the third predetermined light includes steps of:
  exposing the first region and the second region to cause the third additive material and the fourth additive material being within the first region and the second region to generate a first target functional group, wherein the first target functional group absorbs the third predetermined light;
  exposing the first region and the third region to cause the second additive material and the fourth additive material being within the first region and the third region to generate a second target functional group, wherein the second target functional group absorbs the second predetermined light;
  exposing the second region and the third region to cause the first additive material and the fourth additive material being within the second region and the third region to generate a third target functional group, wherein the third target functional group absorbs the first predetermined light.

In some embodiments, the first additive material includes:

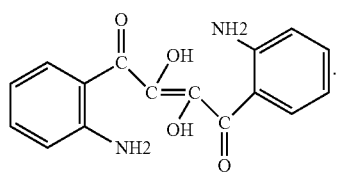 [SMILES: Nc1ccccc1C(=O)/C(O)=C(\O)C(=O)c1ccccc1N]

In some embodiments, the second additive material includes:

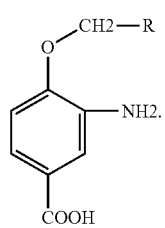

In some embodiments, the third additive material includes:

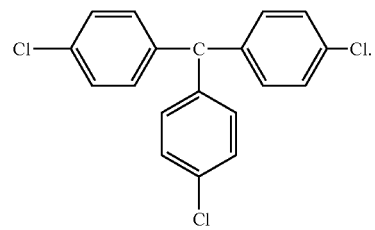 [SMILES: Clc1ccc(C(c2ccc(Cl)cc2)c2ccc(Cl)cc2)cc1]

In some embodiments, the fourth additive material includes:

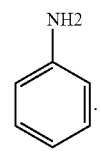

Beneficial Effect

The manufacturing method of the color film substrate according to the embodiments of the present invention, by way of adding a predetermined coloring material in the photoresist layer, after applying multiple exposures, so different regions can transmit different colors of light, thereby improving the manufacturing efficiency of the color film substrate.

DRAWINGS

In order to make the above-mentioned contents of the present invention more comprehensible, the preferred embodiments are described below, and in conjunction with the accompanying drawings, the detailed description is as follows.

DETAILED DESCRIPTION OF PREFERRED EMBODIMENTS

Figure 1:
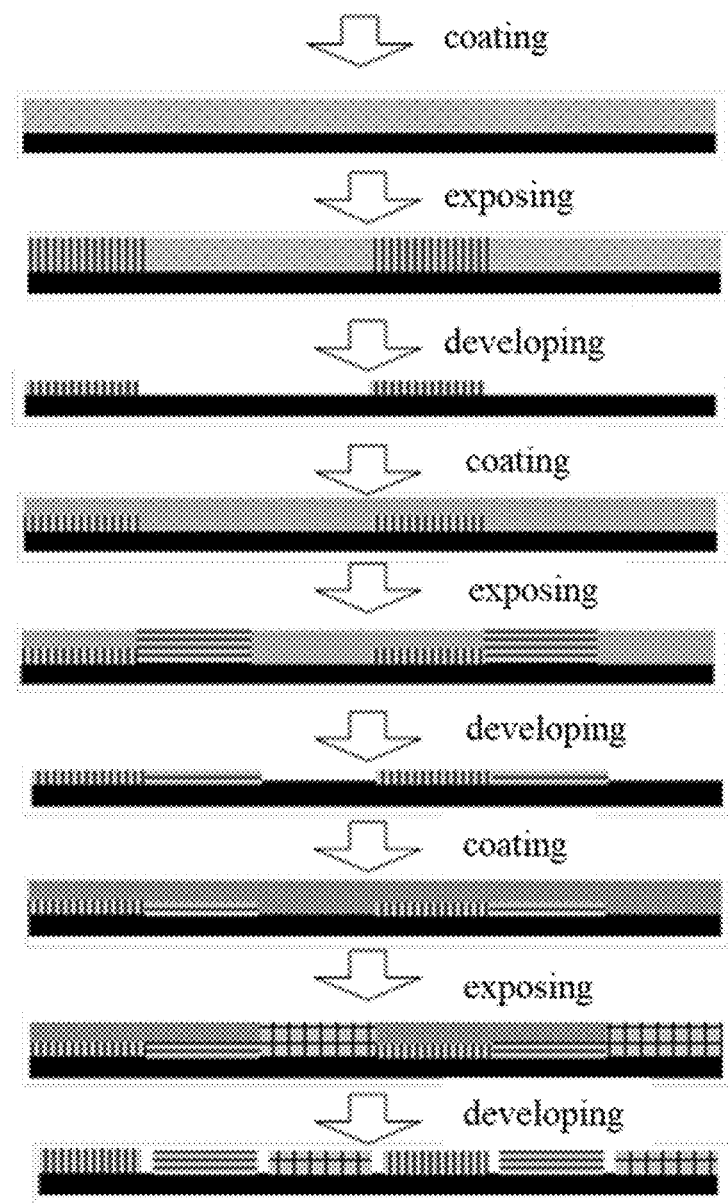
FIG. 1 is a schematic view of a scenario of a manufacturing method of a conventional color film substrate.

The following description of the various embodiments is provided to illustrate the specific embodiments of the invention. The directional terms mentioned in the present invention, such as "upper", "lower", "before", "after", "left", "right", "inside", "outside", "side", etc., are merely refer to the direction of the accompanying drawings. Therefore, the directional terms used is for the purpose of illustration and understanding of the invention, instead of limiting the present invention.

In the figures, elements with similar structure are represented by the same reference numerals.

The term "embodiments" described herein refers to particular features, structures, or characteristics described in connection with the embodiments can be included in at least one embodiment of the invention. The appearances of the terms in various places in the specification are not necessarily referring to the same embodiments, and are not exclusive or alternative embodiments that are mutually exclusive. The person skilled in the art understand explicitly and implicitly that the embodiments described herein may be combined with other embodiments.

Figure 2:
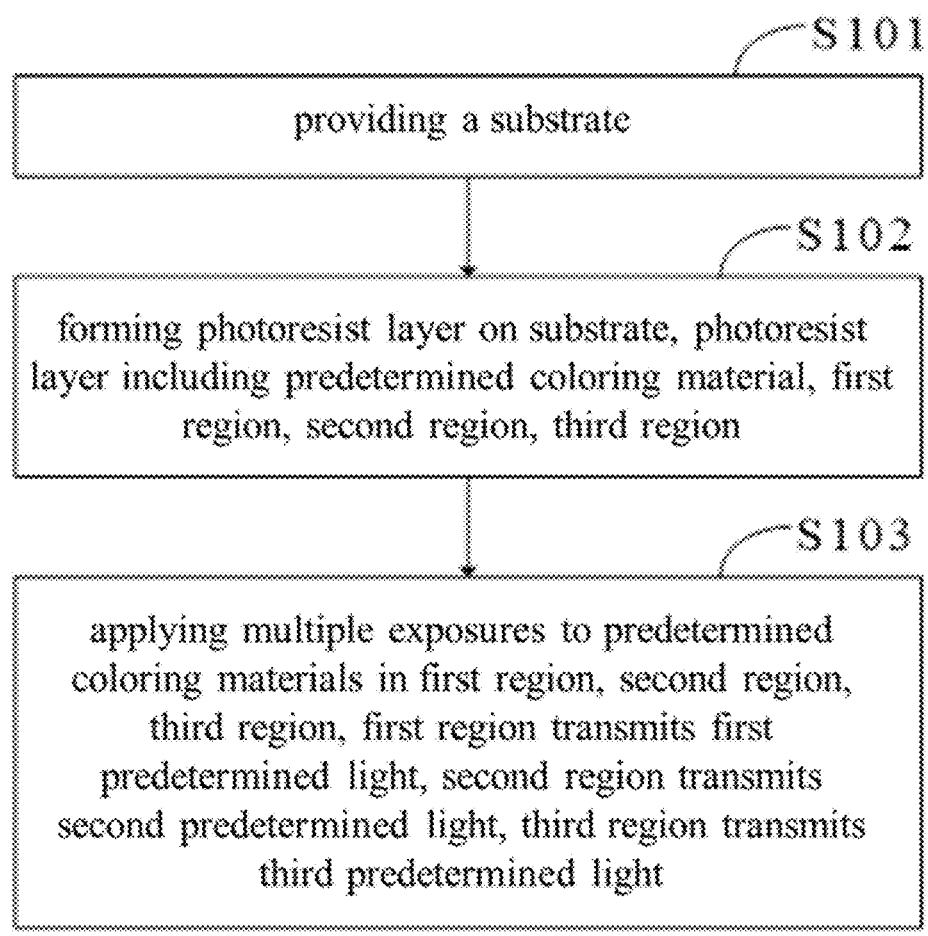
FIG. 2 is a schematic flow chart of a color film substrate manufacturing method according to an embodiment of the present invention.

An embodiment of the present invention provides a color film substrate manufacturing method. Please refer to FIG. 2, which is a schematic flowchart of a color film substrate manufacturing method according to an embodiment of the present invention. The method includes steps of:

In step S101, providing a substrate.

Figure 3:
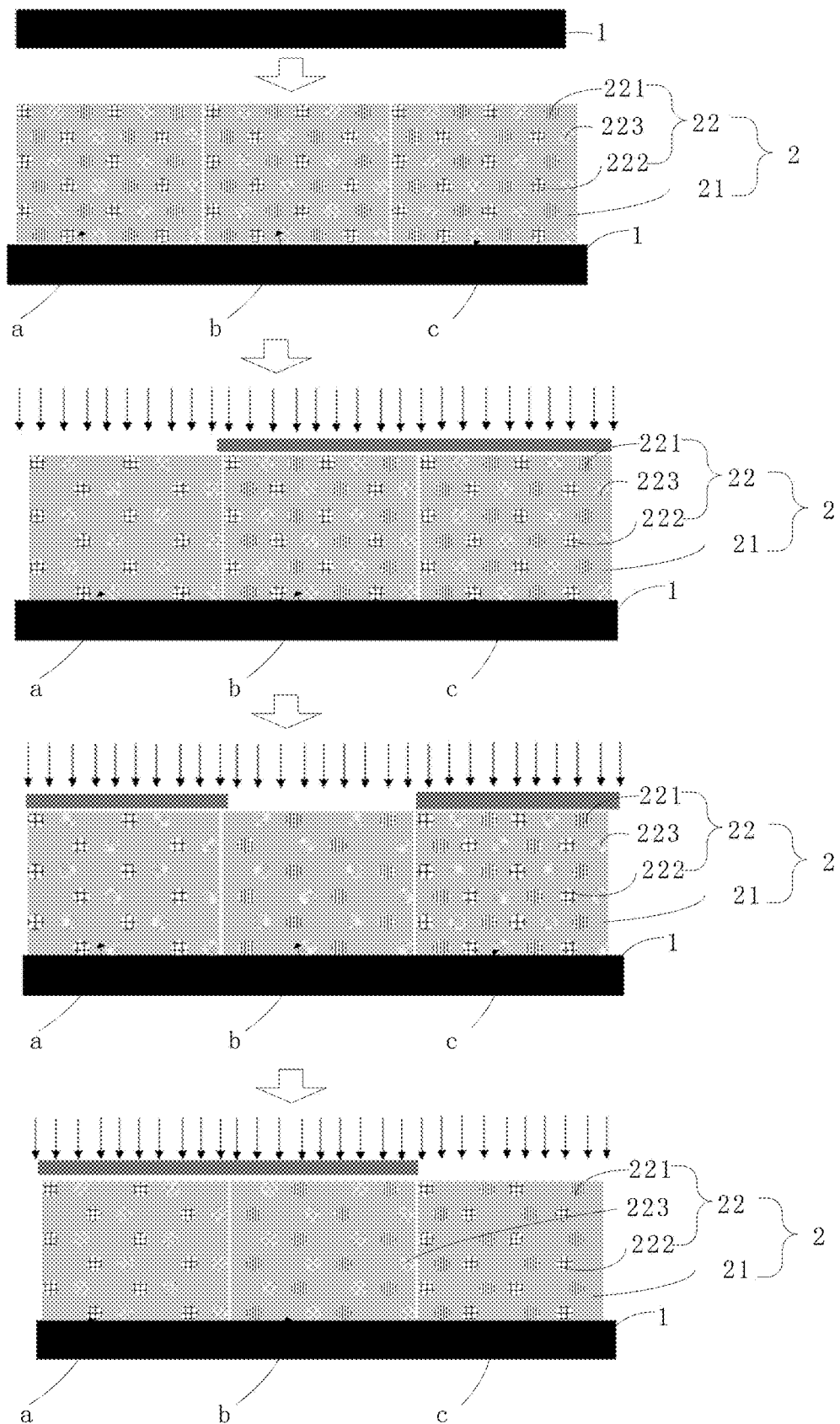
FIG. 3 is a schematic view of a scenario of a color film substrate manufacturing method according to an embodiment of the present invention.

As shown in FIG. 3, substrate 1 is used to carry a photoresist layer 2 thereon. Specifically, the substrate 1 may be a flexible substrate, such as a polyimide substrate, or a rigid substrate, such as a glass substrate.

In step S102, forming a photoresist layer on the substrate, the photoresist layer including a predetermined coloring material, and the photoresist layer including a first region, a second region, and a third region.

A main material of the photoresist layer 2 includes a photoresist material 21, and a mixing material of the photoresist layer 2 includes a predetermined coloring material 22. In some embodiments, the predetermined coloring material 22 is uniformly dispersed in the photoresist material 21. As shown in FIG. 3, the photoresist layer 2 includes first region a, second region b, and third region c which are sequentially arranged, and the above three regions are configured to transmit light with different colors.

In some embodiments, as shown in FIG. 3, the predetermined coloring material 22 includes a first functional group 221, a second functional group 222, and a third functional group 223, the first functional group 221 is configured to absorb a first predetermined light, the second functional group 222 is configured to absorb second predetermined light, and the third functional group 223 is configured to absorb the third predetermined light. The first predetermined light, the second predetermined light, and the third predetermined light may respectively be red light, green light, and blue light, and are not specifically limited herein.

Figure 4:
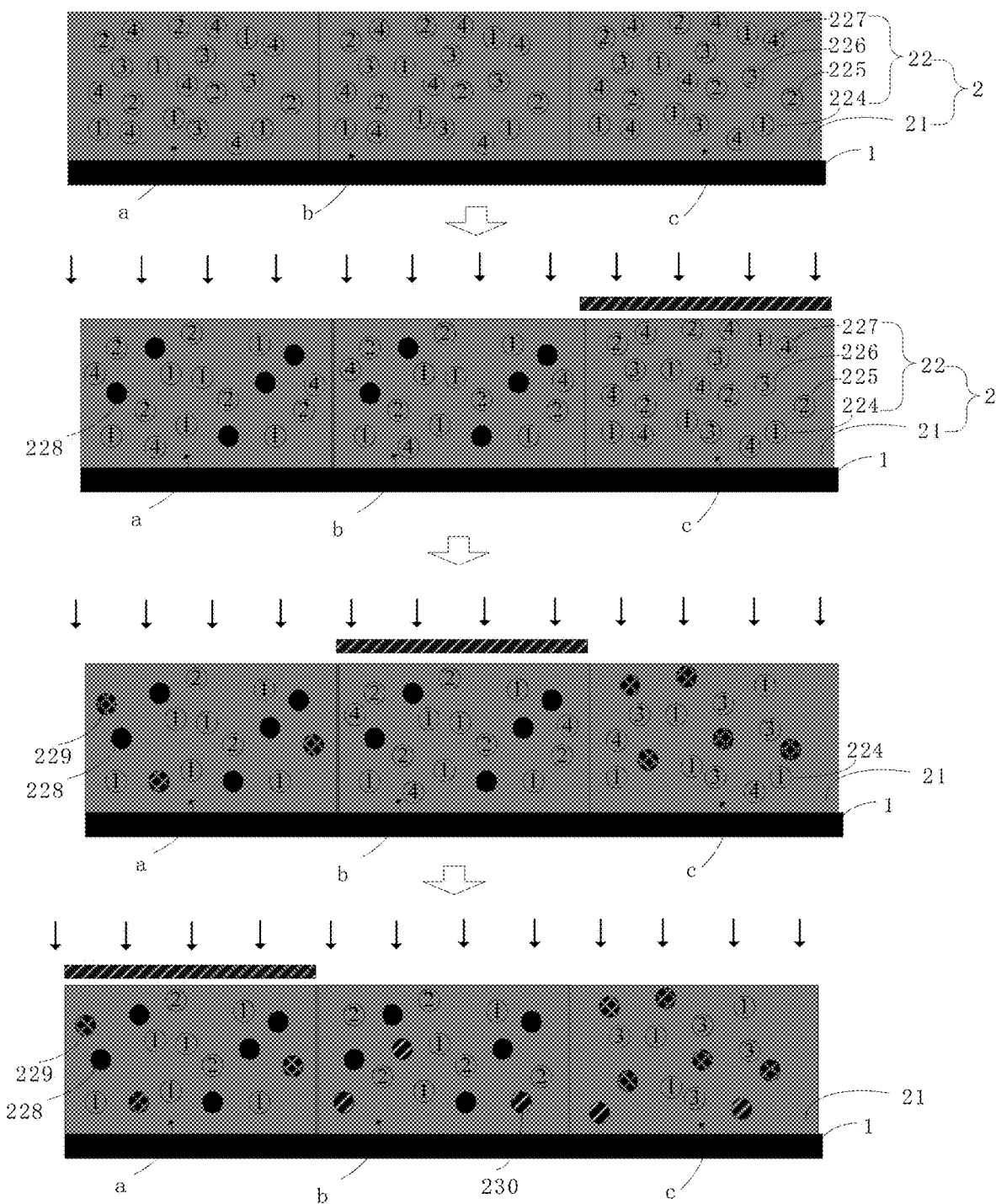
FIG. 4 is another schematic view of a scenario of a color film substrate manufacturing method according to an embodiment of the present invention.

In some embodiments, as shown in FIG. 4, the predetermined coloring material 22 includes a first additive material 224, a second additive material 225, a third additive material 226, and a fourth additive material 227. The above-mentioned additive materials can be reacted one additive material with another additive material to form a specific functional group under a certain exposure condition, and the specific functional group can absorb light with a specific color.

In step S103, applying multiple exposures to the predetermined coloring material of the first region, the second region and the third region, such that the first region enables to transmit a first predetermined light, the second region enables to transmit a second predetermined light, and the third region enables to transmit a third predetermined light.

In some embodiments, when the predetermined coloring material 22 includes the first functional group 221, the second functional group 222, and the third functional group 223, it can realize the function that the first region a, the second region b, and the third region c transmit the corresponding predetermined light by removing the corresponding functional groups in the first region a, the second region b, and the third region c.

Specifically, it is assumed that the first predetermined light is red light, the second predetermined light is green light, and the third predetermined light is blue light, that is, the first region a is configured to transmit red light, the second region b is configured to transmit green light, and the third region b is configured to transmit blue light. As shown in FIG. 3, the first region a may be exposed firstly to decompose the first functional group 221. In one embodiment, the first functional group 221 includes —NH2- and =O, and if one molecule contains both —NH2- and =O, it can decompose

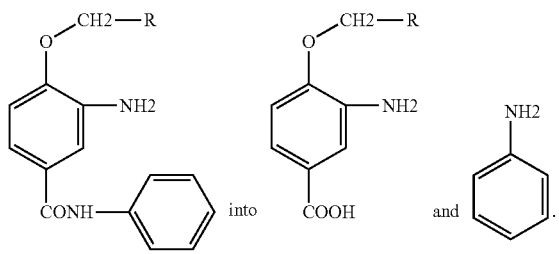

The second region b is then applied an exposure to decompose the second functional group 222. In an embodiment, if the second region b includes

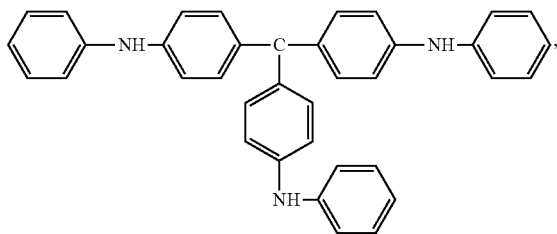 [SMILES: c1ccc(Nc2ccc(C(c3ccc(Nc4ccccc4)cc3)c3ccc(Nc4ccccc4)cc3)cc2)cc1]

which is in the second region b is decomposed. Finally, an exposure is applied to the third region c to decompose the third functional group 223. In an embodiment, the third functional group 223 includes

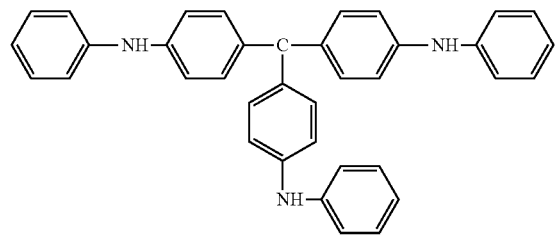 [SMILES: c1ccc(Nc2ccc(C(c3ccc(Nc4ccccc4)cc3)c3ccc(Nc4ccccc4)cc3)cc2)cc1]

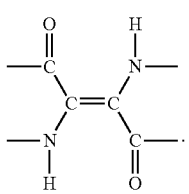

In some embodiments, when the predetermined coloring material 22 includes the first additive material 224, the second additive material 225, the third additive material 226, and the fourth additive material 227, the first additive material 224 includes

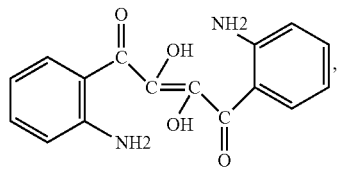 [SMILES: Nc1ccccc1C(=O)/C(O)=C(\O)C(=O)c1ccccc1N]

the second additive material 225 includes

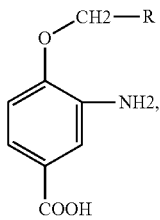

the third additive Material 226 includes

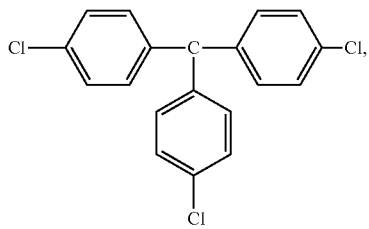 [SMILES: Clc1ccc(C(c2ccc(Cl)cc2)c2ccc(Cl)cc2)cc1]

and
the fourth additive material 227 includes

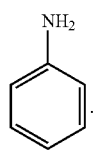

In some embodiments, if the predetermined coloring material 22 is added the first additive material 224, the second additive material 225, the third additive material 226, and the fourth additive material 227. As shown in FIG. 4, firstly, an exposure is applied to the first region a and the second region b, so that the third additive material 226 and the fourth additive material 227 within the first region a and the second region b generate a first target functional group 228, the first target functional group 228 absorbs the third predetermined light. Then, an exposure is applied to the first region a and the third region c, so that the second additive material 225 and the fourth additive material 227 within the first region a and the third region c generate the second target functional group 229, and the second target functional group 229 absorbs the second predetermined light. Finally, an exposure is applied to the second region b and the third region c, so that the first additive material 224 and the fourth additive material 227 within the second region b and the third region c generate a third target functional group 230, and the third target functional group 230 absorbs the first predetermined light. In summary, the first region a absorbs the third predetermined light and the second predetermined light, that is, the first region a transmits the first predetermined light. The second region b absorbs the third predetermined light and the first predetermined light, that is, the second region b transmits the second predetermined light. The third region c absorbs the second predetermined light and the first predetermined light, that is, the third region c transmits the third predetermined light.

The manufacturing method of the color film substrate according to the embodiments of the present invention, by way of adding a predetermined coloring material in the photoresist layer, after applying multiple exposures, so different regions can transmit different colors of light, thereby improving the manufacturing efficiency of the color film substrate.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

The invention claimed is:

1. A color film substrate manufacturing method, comprising steps of:
   providing a substrate;
   coating a photoresist material and a predetermined coloring material on the substrate, wherein the predetermined coloring material is uniformly distributed in the photoresist material; and
   applying multiple exposures to the photoresist material and the predetermined coloring material to form a photoresist layer, wherein the photoresist layer comprises a first region, a second region, and a third region, and the first region is enabled to absorb a second predetermined light and a third predetermined light, the second region is enabled to-absorb a first predetermined light and the third predetermined light, and the third region is enabled to absorb the first predetermined light and the second predetermined light,
   wherein the step of applying multiple exposures comprises:
   performing a first exposure to the first region to decompose a first functional group within the first region;
   performing a second exposure to the second region to decompose a second functional group within the second region; and
   performing a third exposure to the third region to decompose a third functional group within the third region, or
   performing a first exposure to the first region and the second region to cause a third additive material and a fourth additive material respectively within the first region and the second region to generate a first target functional group, wherein the first target functional group absorbs the third predetermined light;

performing a second exposure to the first region and the third region to cause a second additive material and the fourth additive material respectively within the first region and the third region to generate a second target functional group, wherein the second target functional group absorbs the second predetermined light; and performing a third exposure to the second region and the third region to cause a first additive material and the fourth additive material respectively within the second region and the third region to generate a third target functional group, wherein the third target functional group absorbs the first predetermined light.

2. The color film substrate manufacturing method according to claim 1, wherein the predetermined coloring material comprises the first functional group, the second functional group, and the third functional group, and the first functional group is configured to absorb the first predetermined light, the second functional group is configured to absorb the second predetermined light, and the third functional group is configured to absorb the third predetermined light.

3. The color film substrate manufacturing method according to claim 2, wherein the first predetermined light is a red light, and the first functional group comprises —NH$_2$— and =O.

4. The color film substrate manufacturing method according to claim 2, wherein the second predetermined light is a green light, and the step of performing the second exposure to the second region to decompose the second functional group within the second region comprises step of:

if the second region has:

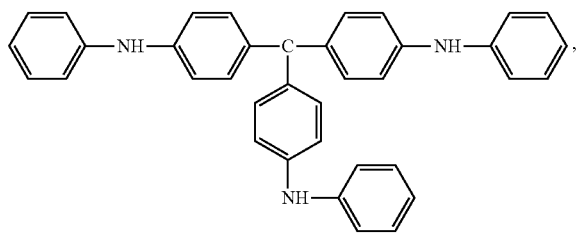 [SMILES: c1ccc(Nc2ccc(C(c3ccc(Nc4ccccc4)cc3)c3ccc(Nc4ccccc4)cc3)cc2)cc1]

then decomposing the

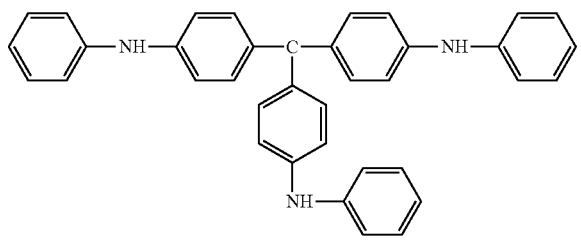 [SMILES: c1ccc(Nc2ccc(C(c3ccc(Nc4ccccc4)cc3)c3ccc(Nc4ccccc4)cc3)cc2)cc1]

within the second region.

5. The color film substrate manufacturing method according to claim 2, wherein the third predetermined light is a blue light, and the third functional group comprises:

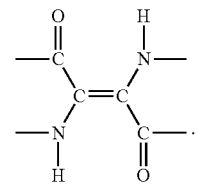

6. The color film substrate manufacturing method according to claim 1, wherein the predetermined coloring material comprises the first additive material, the second additive material, the third additive material, and the fourth additive material.

7. The color film substrate manufacturing method according to claim 6, wherein the first additive material comprises:

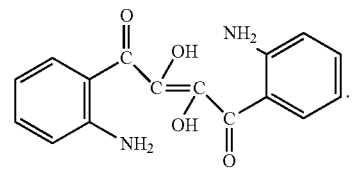 [SMILES: Nc1ccccc1C(=O)/C(O)=C(\O)C(=O)c1ccccc1N]

8. The color film substrate manufacturing method according to claim 6, wherein the third additive material comprises:

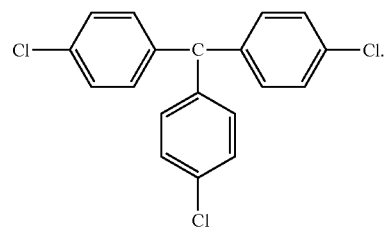 [SMILES: Clc1ccc(C(c2ccc(Cl)cc2)c2ccc(Cl)cc2)cc1]

9. The color film substrate manufacturing method according to claim 6, wherein the fourth additive material comprises:

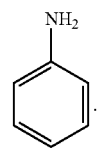

10. A color film substrate manufacturing method, comprising steps of:
providing a substrate;
coating a predetermined coloring material on the substrate; and
applying multiple exposures to the predetermined coloring material to form a photoresist layer, wherein the photoresist layer comprises a first region, a second region and a third region, and the first region enables to absorb a second predetermined light and a third predetermined light, the second region enables to absorb a first predetermined light and the third predetermined light, and the third region enables to absorb the first predetermined light and the second predetermined light, wherein the step of applying multiple exposures comprises:
performing a first exposure to the first region to decompose a first functional group within the first region;
performing a second exposure to the second region to decompose a second functional group within the second region; and
performing a third exposure to the third region to decompose a third functional group within the third region, or
performing a first exposure to the first region and the second region to cause a third additive material and a fourth additive material respectively within the first region and the second region to generate a first target functional group, wherein the first target functional group absorbs the third predetermined light;
performing a second exposure to the first region and the third region to cause a second additive material and the fourth additive material respectively within the first region and the third region to generate a second target functional group, wherein the second target functional group absorbs the second predetermined light; and
performing a third exposure to the second region and the third region to cause a first additive material and the fourth additive material respectively within the second region and the third region to generate a third target functional group, wherein the third target functional group absorbs the first predetermined light.

11. The color film substrate manufacturing method according to claim 10, wherein the predetermined coloring material comprises the first functional group, the second functional group, and the third functional group, and the first functional group is configured to absorb the first predetermined light, the second functional group is configured to absorb the second predetermined light, and the third functional group is configured to absorb the third predetermined light.

12. The color film substrate manufacturing method according to claim 11, wherein the first predetermined light is a red light, and the first functional group comprises —NH$_2$— and =O.

13. The color film substrate manufacturing method according to claim 11, wherein the second predetermined light is a green light, and the step of performing the second exposure to the second region to decompose the second functional group within the second region comprises step of:
if the second region has:

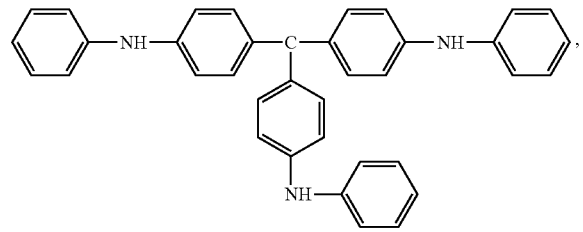 [SMILES: c1ccc(Nc2ccc(C(c3ccc(Nc4ccccc4)cc3)c3ccc(Nc4ccccc4)cc3)cc2)cc1]

then decomposing the

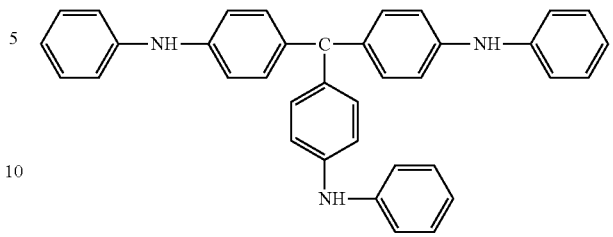

within the second region.

14. The color film substrate manufacturing method according to claim 11, wherein the third predetermined light is a blue light, and the third functional group comprises:

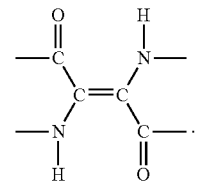

15. The color film substrate manufacturing method according to claim 10, wherein the predetermined coloring material comprises the first additive material, the second additive material, the third additive material, and the fourth additive material.

16. The color film substrate manufacturing method according to claim 15, wherein the first additive material comprises:

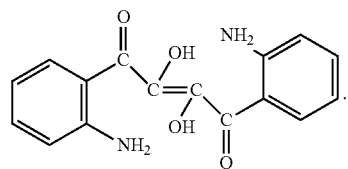 [SMILES: Nc1ccccc1C(=O)/C(O)=C(\O)C(=O)c1ccccc1N]

17. The color film substrate manufacturing method according to claim 15, wherein the third additive material comprises:

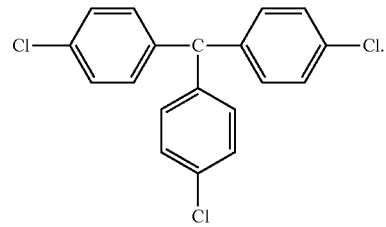 [SMILES: Clc1ccc(C(c2ccc(Cl)cc2)c2ccc(Cl)cc2)cc1]

18. The color film substrate manufacturing method according to claim 15, wherein the fourth additive material comprises:

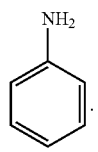
* * * * *